United States Patent
Perino et al.

(10) Patent No.: US 6,426,984 B1
(45) Date of Patent: Jul. 30, 2002

(54) APPARATUS AND METHOD FOR REDUCING CLOCK SIGNAL PHASE SKEW IN A MASTER-SLAVE SYSTEM WITH MULTIPLE LATENT CLOCK CYCLES

(75) Inventors: Donald V. Perino, Los Altos; Haw-Jyh Liaw, Fremont; Kevin S. Donnelly, San Francisco, all of CA (US)

(73) Assignee: Rambus Incorporated, Mountain View, CA (US)

( * ) Notice: Subject to any disclaimer, the term of this patent is extended or adjusted under 35 U.S.C. 154(b) by 0 days.

(21) Appl. No.: 09/306,897

(22) Filed: May 7, 1999

(51) Int. Cl.[7] .............................. H04L 7/00; H04L 5/14
(52) U.S. Cl. ...................................... 375/356; 375/377
(58) Field of Search ............................... 375/371, 356, 375/257, 219, 220, 221, 354, 373, 376, 377; 327/141, 144, 153, 161, 147, 156; 370/516, 518; 713/503, 600, 601

(56) References Cited

U.S. PATENT DOCUMENTS

| | | | |
|---|---|---|---|
| 4,847,867 A | * 7/1989 | Nasu et al. | 375/257 |
| 5,355,391 A | * 10/1994 | Horowitz et al. | 375/257 |
| 5,432,823 A | 7/1995 | Gasbarro et al. | 375/256 |
| 5,485,490 A | * 1/1996 | Leung et al. | 375/371 |
| 5,619,158 A | * 4/1997 | Casal et al. | 327/292 |
| 5,724,392 A | * 3/1998 | Klimek et al. | 375/257 |
| 6,049,846 A | * 4/2000 | Farmwald et al. | 710/126 |
| 6,233,294 B1 | * 5/2001 | Bowers et al. | 375/356 |

OTHER PUBLICATIONS

Efendovich et al, "Multifrequency Zero–Jitter Delayed Locked Loop", IEEE vol. 29 No. 1, Jan. 1994.*

* cited by examiner

*Primary Examiner*—Young T. Tse
(74) *Attorney, Agent, or Firm*—Pennie & Edmonds LLP

(57) ABSTRACT

A digital system includes a master device, a set of slave devices, and a clock generator to generate a clock signal. A transmission channel includes a clock-to-master path extending from the clock generator, through the set of slave devices, to the master device. The transmission channel also includes a clock-from-master path extending from the master device and through the set of slave devices. The transmission channel also includes a slave-to-master path positioned between a first slave device of the set of slave devices and the master device. A master-to-slave path is positioned between the master device and the first slave device. The cumulative length of the slave-to-master path and the master-to-slave path creates a master routing phase shift between a clock signal on the clock-to-master path and a clock signal on the clock-from-master path. A first lead samples the clock signal on the slave-to-master path. A second lead samples the clock signal on the master-to-slave path. A clock latency adjustment circuit is connected to the first lead and the second lead to produce an adjusted clock signal on the master-to-slave path to compensate for the master routing phase shift.

27 Claims, 10 Drawing Sheets

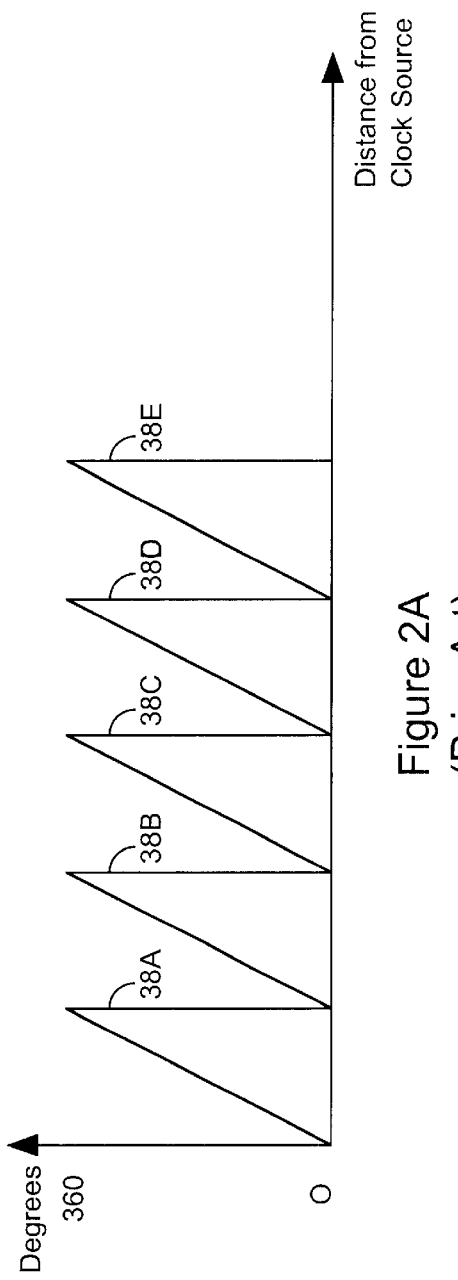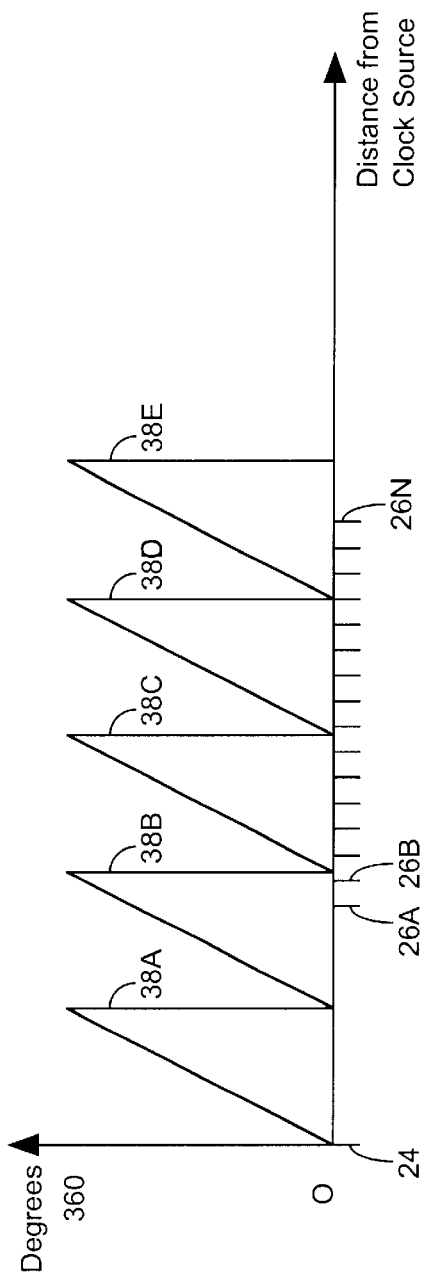

APPARATUS AND METHOD FOR REDUCING CLOCK SIGNAL PHASE SKEW IN A MASTER-SLAVE SYSTEM WITH MULTIPLE LATENT CLOCK CYCLES

BRIEF DESCRIPTION OF THE INVENTION

This invention relates generally to digital systems. More particularly, this invention relates to improving clock signal phase skew performance within a master-slave digital system that has multiple latent clock cycles.

BACKGROUND OF THE INVENTION

FIG. 1 is a simplified illustration of a prior art synchronous bus system that reduces clock skew. The system is described in U.S. Pat. No. 5,432,823, which is assigned to the assignee of the present invention, and is incorporated by reference herein.

The system 20 of FIG. 1 includes a clock generator 22, a master device 24, and a set of slave devices 26_A through 26_N. A transmission channel is comprised of three components: a clock-to-master path 28, a turn-around path 29, and a clock-from-master path 30. The transmission channel ends at a termination block 31, which may be implemented with a resistor. Each clock pulse from the clock generator 22 traverses from the clock-to-master path 28, through the turn-around path 29, through the clock-from-master path 30, and into the termination block 31. The turn-around path 29 may be implemented as a wire linking a package pin connected to the clock-to-master path 28 and a package pin connected to the clock-from-master path 30. The phantom lines 33 illustrate that the turn-around can be implemented as a single package pin to which the clock-to-master path 28 and the clock-from-master path 30 are connected, provided that the created stub is relatively short.

The clock generator 22 is any standard clock source. The master device 24 is a device that can communicate with other master devices and with slave devices, and is located near the turn-around path 29. By way of example, the master device 24 may be a microprocessor, a memory controller, or a peripheral controller.

The slave devices 26 can only communicate with master devices and may be located anywhere along the transmission channel. The slave devices 26 may be implemented with high speed memories, bus transceivers, peripheral devices, or input/output ports.

In the system of FIG. 1, a data/control bus 36 (sometimes referred to simply as a data bus 36) is used to transport data and control signals between the master device 24 and the slave devices 26_A through 26_N. This operation is timed by the clock signals on the transmission channel (28, 29, 30). More particularly, the master device 24 initiates an exchange of data by broadcasting an access request packet on the data bus 36. Each slave device 26 decodes the access request packet and determines whether it is the selected slave device and the type of access requested. The selected device then responds appropriately, either reading or writing a packet of data in a pipelined fashion.

In the system of FIG. 1, the master device 24 transmits data on the bus 36 contemporaneously with clock signals on the clock-from-master path 30. In other words, the transmission of data from the master device 24 to the slave devices 26 is timed by the clock signals on the clock-from master path 30. Conversely, each slave device transmits data contemporaneously with the clock signal on the clock-to-master path 28. That is, the transmission of data from the slave devices 26 to the master device 24 is timed by the clock signals on the clock-to-master path 28. The scheme of having clock and data signals travel in the same direction is used to reduce clock data skew.

In many master-slave systems, the time of flight of a clock signal along the transmission channel is a multiple of a single cycle of the clock signal. In other words, it takes more than one clock cycle for a clock pulse to traverse the length of the transmission channel (28, 29, 30). As clock speeds increase and the number of slave devices increases, the number of clock cycles required for a clock pulse to traverse the length of the transmission channel increases.

Each clock cycle that transpires during the time of flight of a clock pulse on the transmission channel is referred to as a latent clock cycle. Thus, for example, if it takes five clock cycles for a clock pulse to traverse the length of a transmission channel, then the system has five latent clock cycles. Since data is transmitted with each clock cycle, data is in a sense "stored" on the data bus 36 with each latent clock cycle. In other words, a packet of data may be launched with each latent clock cycle, resulting in several packets of data on the data bus 36. Since the system must keep track of this information on the data bus, considerable complexity is introduced into master-slave systems that have latent clock cycles. It would be highly desirable to reduce the complexity in such systems.

Latent clock cycles are more fully appreciated with reference to FIGS. 2A and 2B. FIG. 2A illustrates increasing cycle degrees on the vertical or y-axis and increasing distance from the clock source on the horizontal or x-axis. As the distance from the clock source increases, degrees of phase skew increase until a full 360 degree phase skew or latent cycle exists, as shown with waveform 38A, and subsequent waveforms 38B–38E.

FIG. 2B maps the components of FIG. 1 onto the plot of FIG. 2A. Thus, FIG. 2B illustrates the position of the master device 24 at the intersection of the axes. The first slave device 26A and second slave device 26B correspond to the second domain, represented by waveform 38B. The slave device 26N corresponds to the fifth domain, represented by waveform 38E. In sum, the slave devices fall into four different domains (38B, 38C, 38D, and 38E).

The problem of latent clock cycles is more fully appreciated in connection with a specific example. FIG. 1 illustrates a slave-to-master path 32 positioned between the master device 24 and the first slave device 26_A. The figure also illustrates a master-to-slave path 34 positioned between the master device 24 and the first slave device 26_A. System designers frequently place a set of slave devices 26 relatively far away from the master device 24; this distance can introduce considerable clock skew. Even if the slave devices 26 are positioned relatively close to the master device 24, the distance will introduce some clock skew. This phenomenon can be appreciated with reference to FIG. 3. Waveform 40 represents a clock pulse received at the master device 24 from the clock-to-master path 28. Waveform 42 represents the same clock pulse as applied by the master device 24 to the clock-from-master path 30. Observe that the two signals are in phase because only the length of the turn-around path 29 separates the two signals.

Waveforms 44 and 46 illustrate the same clock pulses when they are received at slave device 26_A (Slave_A). In other words, waveform 44 illustrates the clock pulse when it was received from the clock generator 22 at slave device 26_A, while waveform 46 illustrates the same clock pulse when it was received from the master device 24 at slave device 26_A (after traversing the length of the slave-to-master path 32, the turn-around path 29, and the master-to-slave path 34). As shown with arrow 48, the two clock pulses are considerably out of phase. This phase skew is attributable to a relatively long slave-to-master path 32 and master-to-slave path 34.

Arrow 54 illustrates the phase skew between clock signals 50 and 52 at slave device 26_B (Slave_B). At slave device 26_B there is a phase skew plus an additional latent cycle. Observe that at Slave_A the phase skew is larger than at Slave_B. The reason for this is that at Slave_B a latent cycle (a complete 360° phase shift) has been introduced along with additional skew.

Waveforms 56 and 58 illustrate the clock pulses when they reach the last slave device 26_N (Slave_N). Arrow 60 illustrates the phase skew between the two signals. At this point, there may be several latent cycles between the two clock pulses plus a phase skew.

As previously indicated, latent cycles introduce complexity into a master-slave system and result in lower performance. Phase skew is problematic because communication between a slave device and a master device relies upon synchronized clock signals (i.e., synchronization between the clock signal on the clock-to-master path 28 and the clock signal on the clock-from-master path 30).

The phase skew and latent cycles attributable to the length of the transmission channel through the slave devices is uncontrollable. The phase skew introduced by the distance of the slave-to-master path 32 and the master-to-slave path 34 can be substantially reduced by shortening the distance of the slave-to-master path 32 and the master-to-slave path 34. Unfortunately, this option is usually unavailable because system designers want the flexibility to have an arbitrary distance between the master and slave devices. When the distance between the master and slave devices is large, substantial phase skew or one or more latent clock cycles are introduced into the system before processing at the first slave device commences.

As previously indicated, it is always desirable to reduce master-slave system complexity by reducing the number of latent cycles. This goal is especially important as clock speeds increase and slave device numbers increase. It is also important to allow flexibility in the length of the clock-to-master path and the clock-from-master path. It would be highly desirable to provide a system in which additional flexibility was afforded in the length of the clock-to-master path and clock-from-master path, while eliminating latent cycles and phase skew introduced by the clock-to-master path and the clock-from-master path.

SUMMARY OF THE INVENTION

The apparatus of the invention is a digital system with a master device, a set of slave devices, and a clock generator to generate a clock signal. A transmission channel includes a clock-to-master path extending from the clock generator, through the set of slave devices, to the master device. The transmission channel also includes a clock-from-master path extending from the master device and through the set of slave devices. The transmission channel also includes a slave-to-master path positioned between a first slave device of the set of slave devices and the master device. A master-to-slave path is positioned between the master device and the first slave device. The cumulative length of the slave-to-master path and the master-to-slave path creates a master routing phase shift between a clock signal on the clock-to-master path and a clock signal on the clock-from-master path. A first lead samples the clock signal on the slave-to-master path. A second lead samples the clock signal on the master-to-slave path. A clock latency adjustment circuit is connected to the first lead and the second lead to produce an adjusted clock signal on the master-to-slave path to compensate for the master routing phase shift.

The method of the invention includes the step of receiving a clock-to-master clock signal at a slave device. A clock-from-master clock signal is collected at the slave device; the clock-from-master signal is out of phase with the clock-to-master clock signal. The clock-to-master clock signal and the clock-from-master clock signal are processed to produce an adjusted clock-from-master clock signal at the slave device that is substantially in phase with the clock-to-master clock signal at the slave device.

The invention is distinguishable over the prior art in view of the number of clock drivers per channel. The invention uses two clock drivers for each channel: one driver supplies the Clock-To-Master (CTM) signal, while the second driver supplies the Clock-From-Master (CFM) signal. The location of the clock drivers varies according to the embodiment. For example, the clock drivers may both be located in the clock generator chip, or both be located on the master chip, or one could be in each of the above locations. Regardless of the position, the Clock-From-Master signal amplitude is improved compared to the single-driver scheme.

The second clock driver has an associated phase interpolator and phase comparator. The phase interpolator is controlled by the phase comparator, which adjusts phase such that there is zero phase angle at its inputs. The inputs to the phase comparator vary with different embodiments. For example, they may be connected, such as to measure phase angle (CTM vs. CFM) at a point inside the master package, or at some desired location along the channel. In this second case, the resulting system is quite different from the prior art in several regards. First, by defining the zero phase locus at any arbitrary point along the channel, it becomes unlikely that there is zero phase between CTM and CFM at the master. This will require additional complexity in the master. The benefit is that the number of different clock domains spanned by the slaves can be minimized, resulting in fewer delay stages in each slave.

One prior art technique for dealing with multiple clock domains is to "levelize" the channel by adding pipeline delay stages, such that data reaches the master at the same time from different slaves. The invention obviates the need for these prior art delay stages.

BRIEF DESCRIPTION OF THE DRAWINGS

For a better understanding of the invention, reference should be made to the following detailed description taken in conjunction with the accompanying drawings, in which:

FIGS. 2A and 2B illustrate the concept of latent cycles.

Like reference numerals refer to corresponding parts throughout the drawings.

DETAILED DESCRIPTION OF THE INVENTION

Figure 4:
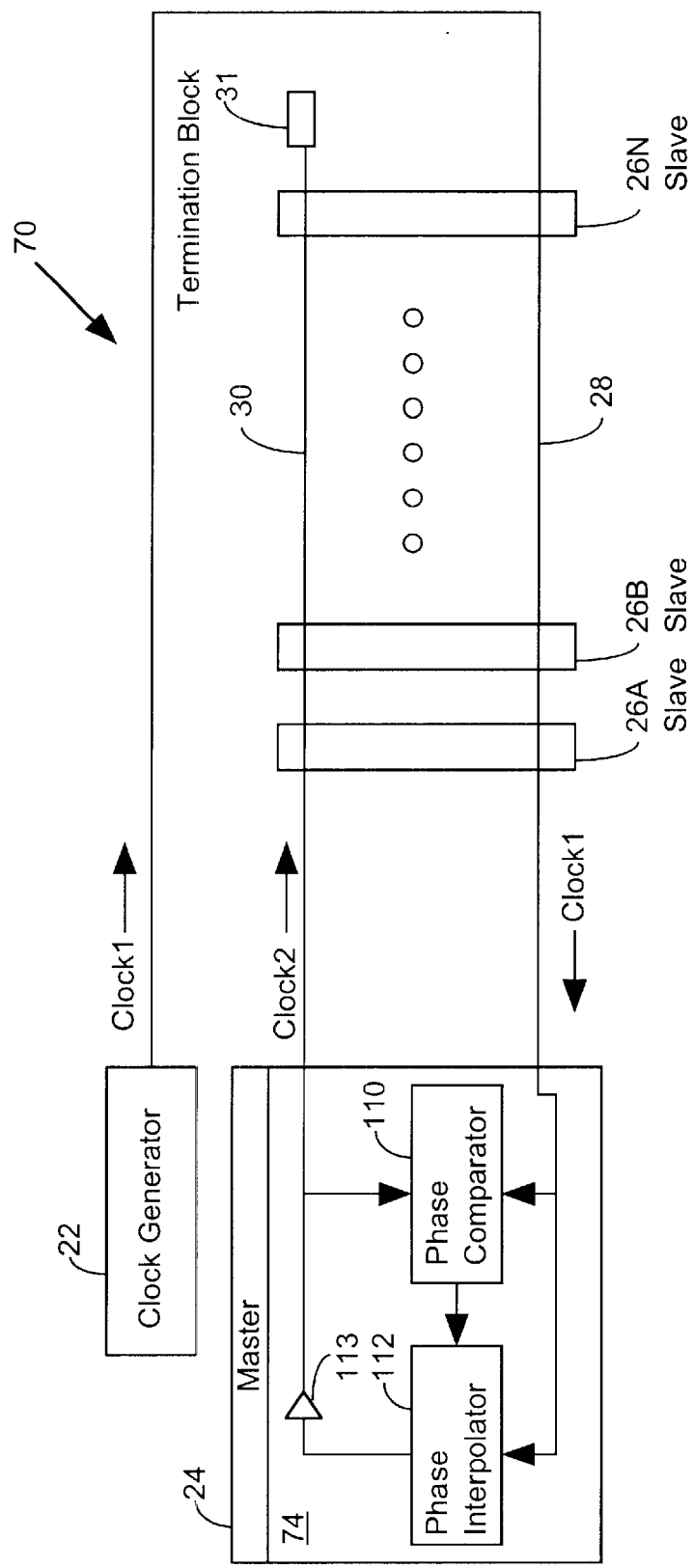
FIG. 4 is a generalized depiction of a master-slave system in accordance with an embodiment of the invention.

FIG. 4 is a simplified illustration of a master-slave system 70 in accordance with an embodiment of the invention. As with the system of FIG. 1, the system 70 of FIG. 4 includes a master device 24 and a set of slave devices 26A through 26N. The system 70 includes a clock-to-master path 28 and a clock-from-master path 30, as was the case in the system of FIG. 1.

Figure 1:
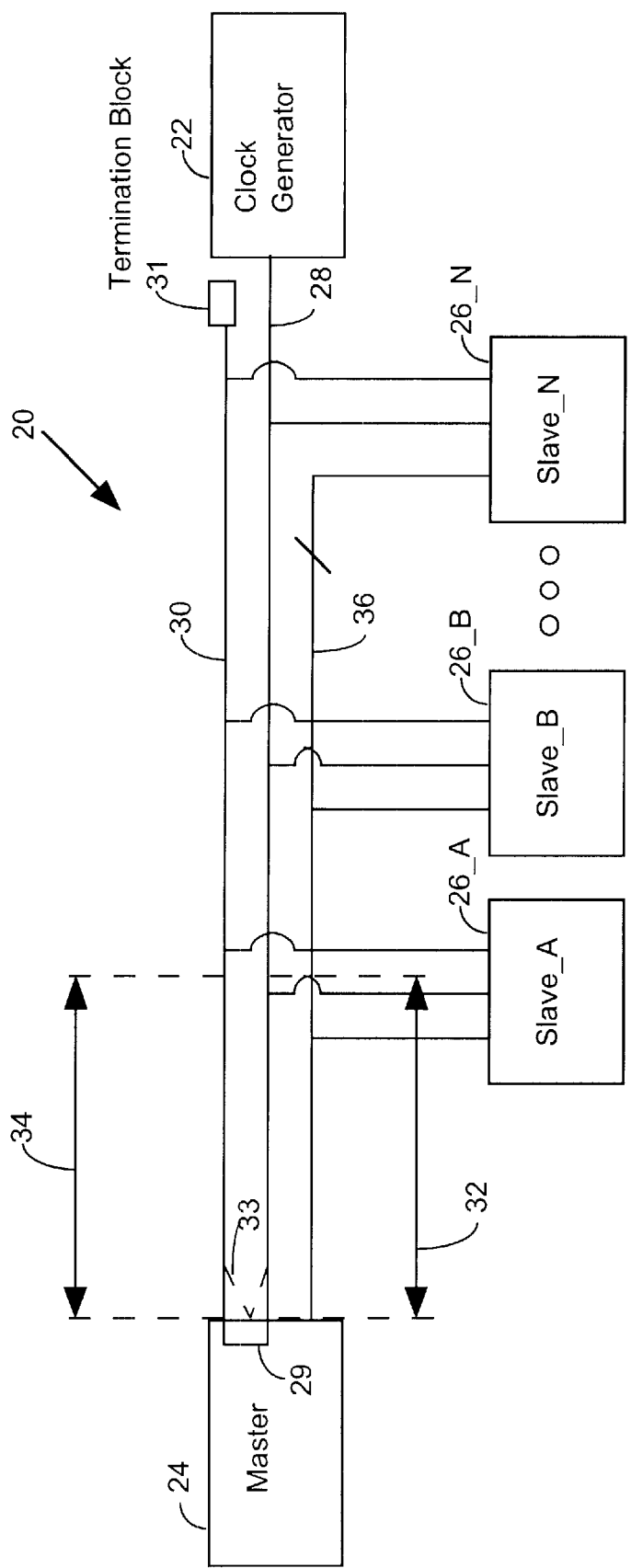
FIG. 1 illustrates a master-slave system in accordance with the prior art.
Figure 3:
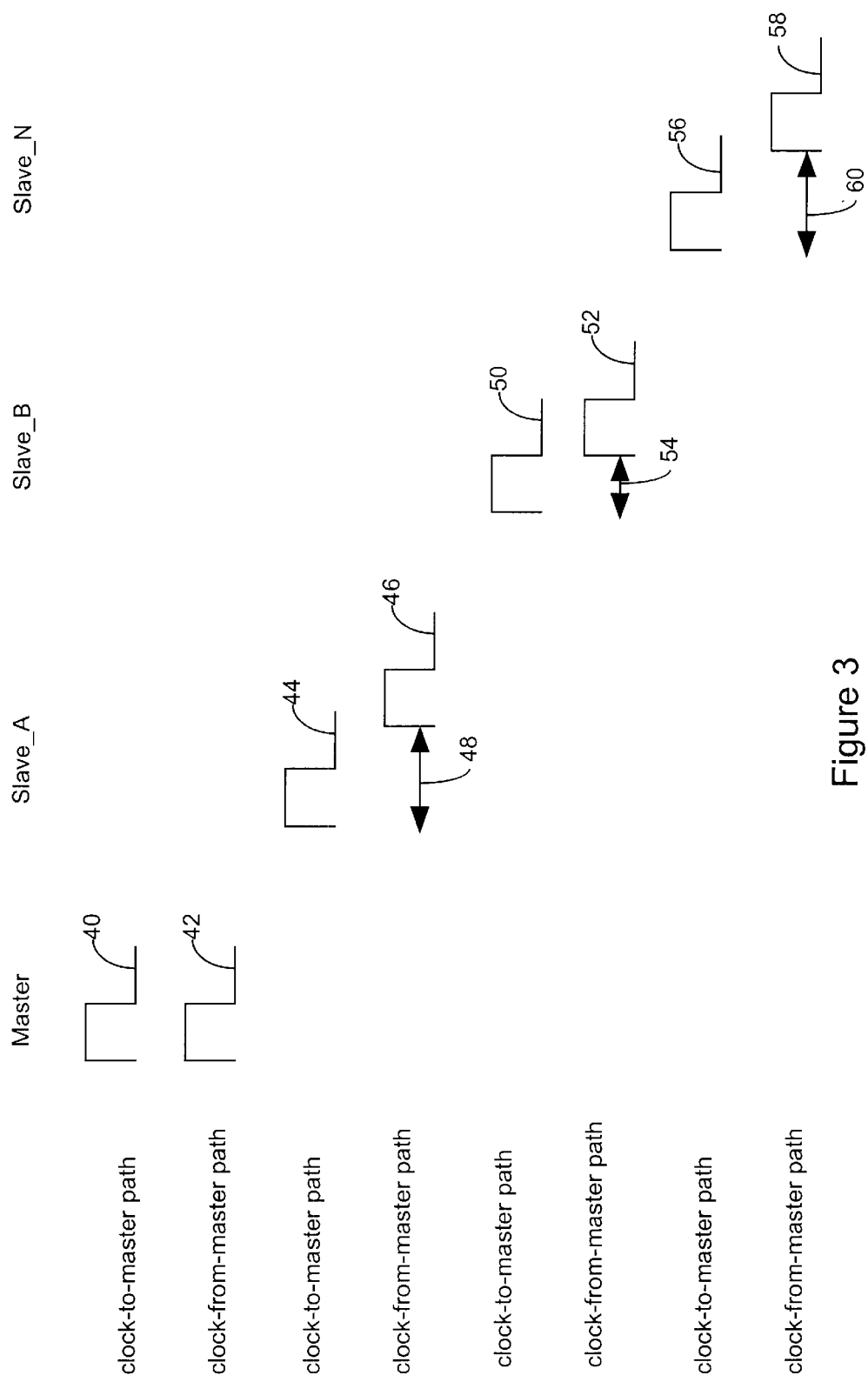
FIG. 3 illustrates the problem of phase skew and latent cycles associated with the prior art master-slave system of FIG. 1.

The system of FIG. 4 departs from the system of FIG. 1 in that the physical turn-around path 29 or 33 of FIG. 1 does not exist. Instead, the clock signal Clock1) from the clock-to-master path 28 is terminated or processed to create a new lock signal (Clock2) that is applied to the clock-from-master path 30. The new clock signal (Clock2) has a higher amplitude than the attenuated Clock1 signal.

The zero phase buffer 74 is utilized to create a "virtual turn-around" in which a new clock signal with improved amplitude and zero delay is applied to the clock-from-master path 30. As demonstrated below, the zero phase buffer 74 actively buffers the incoming clock signal on line 28 and creates a zero delay clock signal for application to line 30. In other words, the clock signal (Clock1) on the clock-to-master path 28 is in phase with the clock signal (Clock2) on the clock-from-master path 30 when each signal is received at the slave device 26A, regardless of the distance between the master 24 and the first slave device 26A. The components of the zero phase buffer 74 are discussed below. In addition, various implementations of the zero phase buffer function are described in connection with the following discussion.

Figure 5:
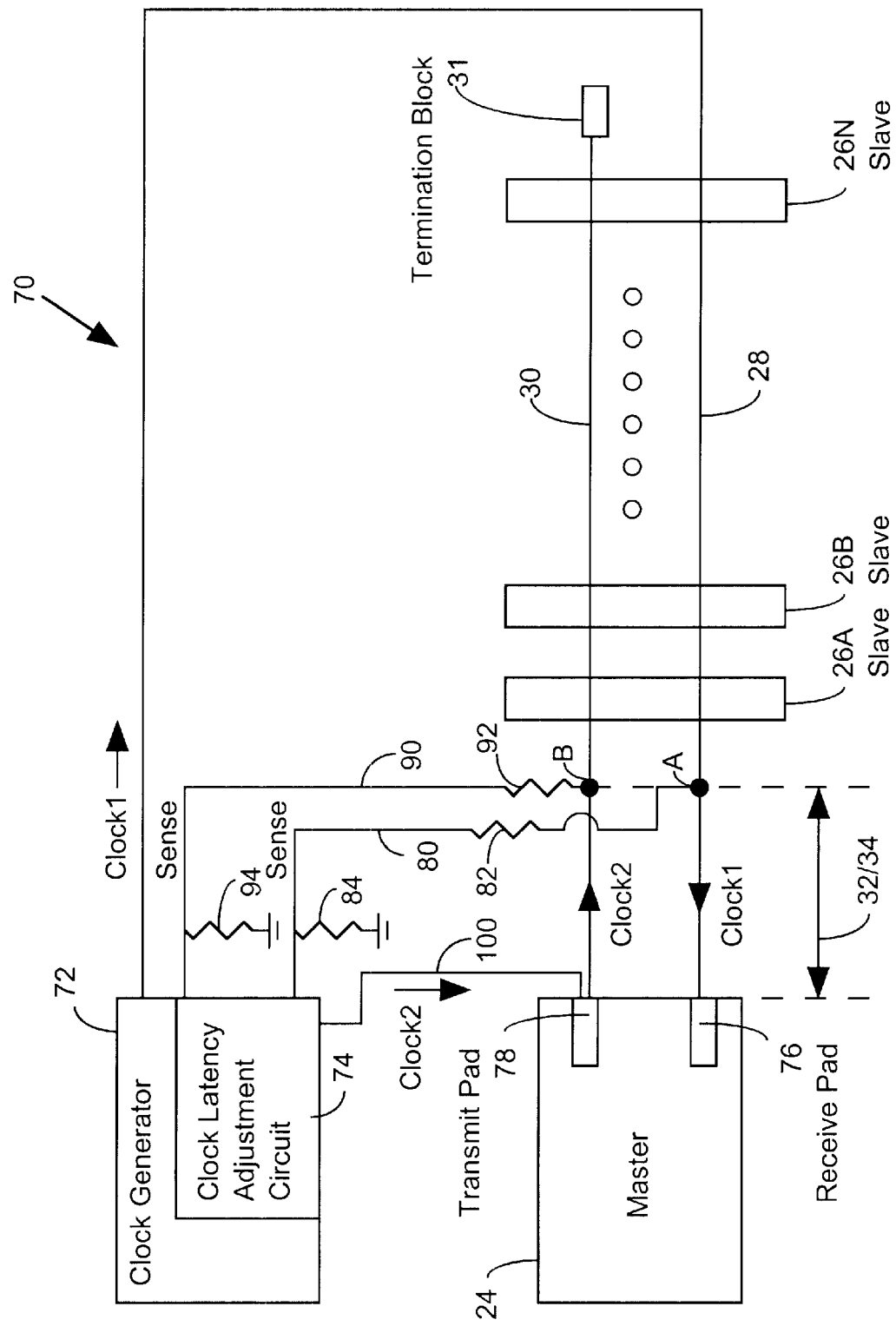
FIG. 5 is a more detailed illustration of a master-slave system in accordance with an embodiment of the invention.

FIG. 5 illustrates a master-slave system 70 in accordance with an embodiment of the invention. As with the system of FIG. 1, the system 70 of FIG. 5 includes a master device 24 and a set of slave devices 26A through 26N. The system 70 also includes a slave-to-master path 32 between the first slave device 26A and the master device 24. The system 70 further includes a master-to-slave path 34 between the master device 24 and the first slave device 26A, as was the case in the system of FIG. 1.

The system of FIG. 5 departs from the system of FIG. 1 in that the clock generator 72 of the system 70 includes a zero phase buffer or clock latency adjustment circuit 74. The purpose of the clock latency adjustment circuit 74 is to substantially eliminate any clock skew otherwise introduced by the slave-to-master path 32 and the master-to-slave path 34. Thus, the clock latency adjustment circuit 74 allows substantial design flexibility, as the slave-to-master path 32 and the master-to-slave path 34 may be any length, while the number of latent cycles is still minimized.

The clock latency adjustment circuit 74 operates in the following manner. A first lead 80 is used to sample the clock signal at node A of the slave-to-master path 32. The first lead 80 includes a series resistor 82 and a shunt resistor 84. A second lead 90 is used to sample the clock signal at node B of the master-to-slave path 34. The second lead 90 includes a series resistor 92 and a shunt resistor 94.

Figure 6:
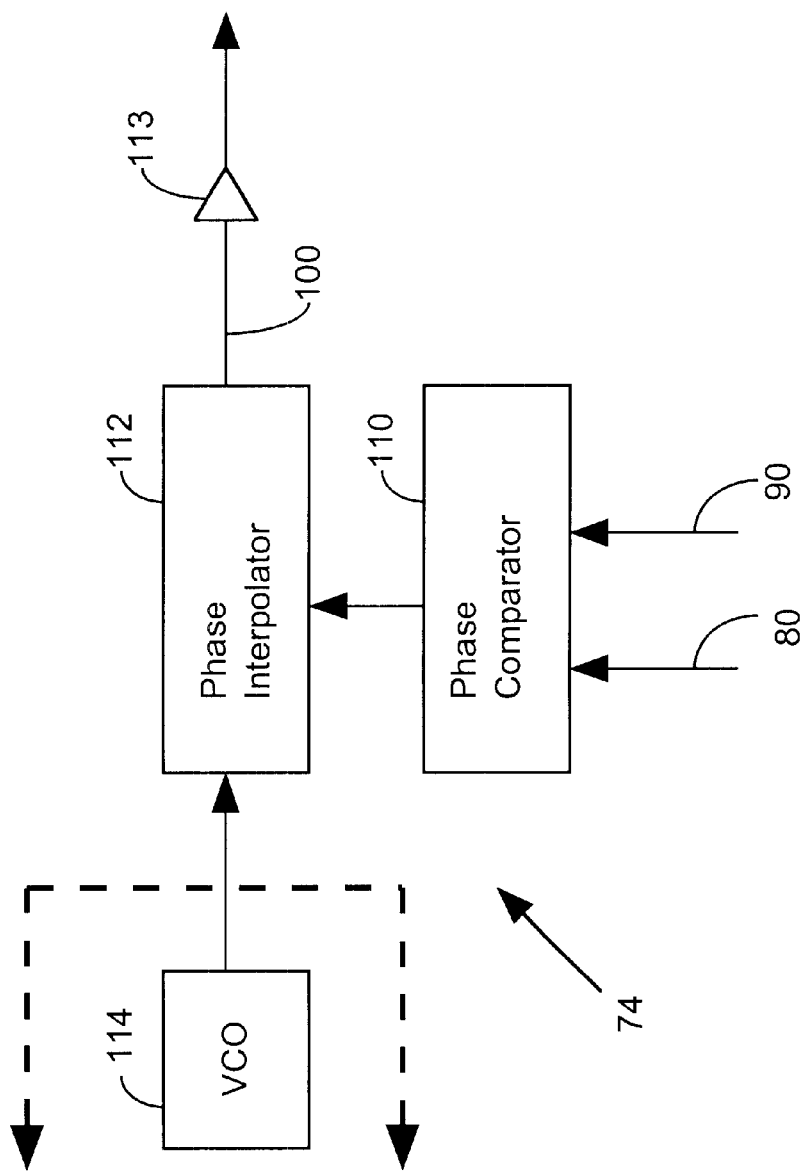
FIG. 6 illustrates a clock latency adjustment circuit in accordance with an embodiment of the invention.

FIG. 6 illustrates an embodiment of the clock latency adjustment circuit 74. Similar components are shown in FIG. 4. As shown in these figures the phase comparator 110 compares the phase between the Clock1 signal (e.g., on lead 80) and the Clock2 signal (e.g., on lead 90) and produces a phase error signal. The phase error signal is delivered to a phase interpolator 112. The phase interpolator 112 also receives a reference clock signal. The reference clock signal may be the Clock1 signal, as shown in FIG. 4. Alternately, the reference clock signal may be from a voltage controlled oscillator (VCO) 114, as shown in FIG. 6. The VCO 114 of FIG. 6 may be positioned in the zero phase buffer 74 or it may be positioned in a separate device, such as a clock generator 22.

The phase interpolator 112 produces a phase adjusted clock signal on node 100, which may be amplified by a conventional buffer 113. As shown in FIG. 5, node 100 is applied to a master transmit pad 78, which electrically links the signal with the master-to-slave path 34 of the clock-from-master path 30. Thus, the clock signal processed on the clock-from-master path 30 is not received from the turn-around path 29 of FIG. 1. Instead, the technique of the invention eliminates this path and creates a new clock signal to compensate for clock skew. Observe that the incoming clock signal (Clock1 in FIG. 5) from the clock-to-master path 28 is applied to a receive pad 76, but is not directly routed to the clock-from-master path 30, as was the case in the device of FIG. 1. Instead, the derived clock signal (Clock2) from the clock latency adjustment circuit 74 is applied to the lead 100 and then the clock-from-master path 30.

The clock latency adjustment circuit 74 operates as a phase-locked loop to keep the clock signal at position A of the slave-to-master path 32 in phase with the clock signal at position B of the master-to-slave path 34. The first lead 80 and second lead 90 may be positioned as close as practicable to the first slave device 26A to establish increased phase concurrence.

Figure 7:
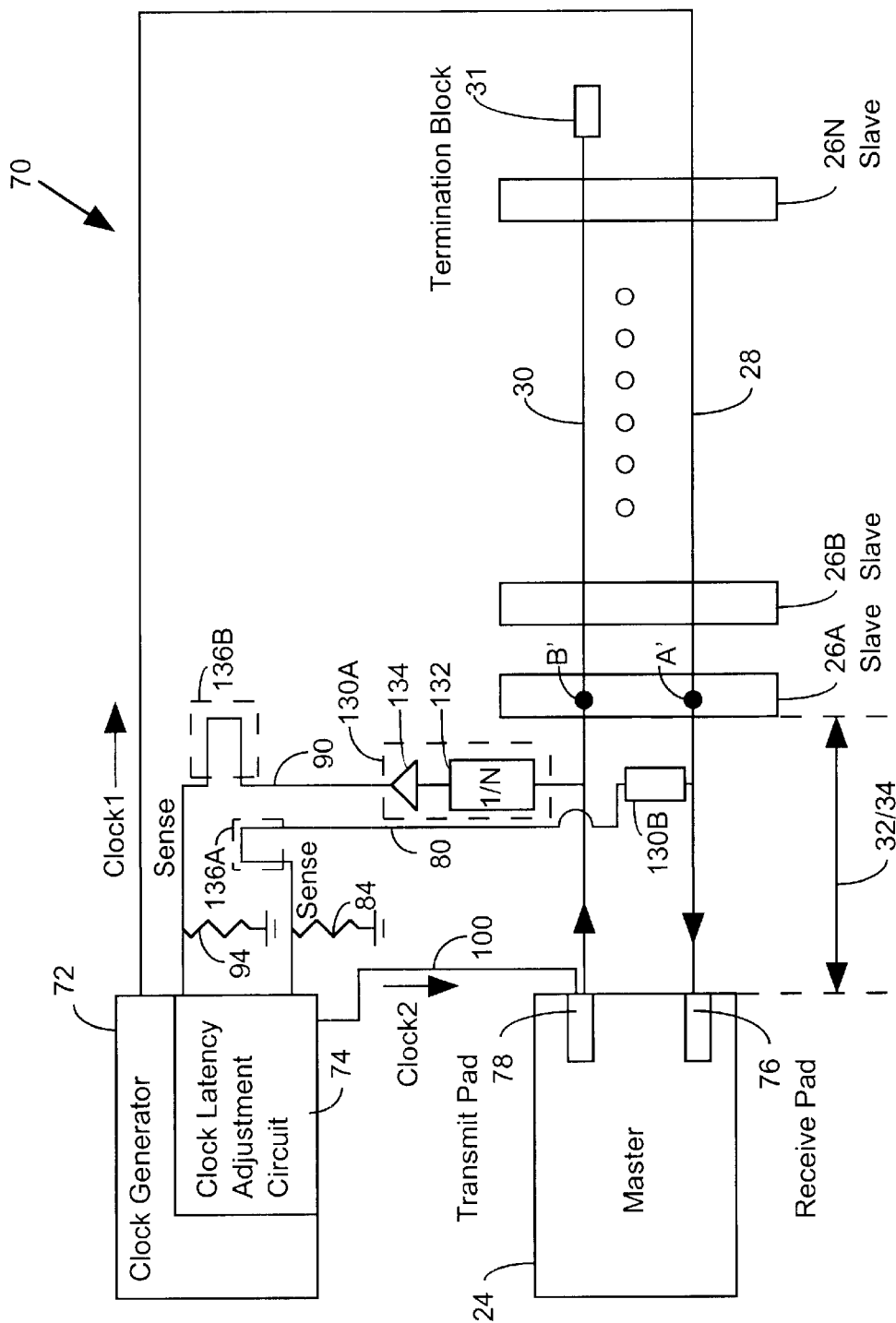
FIG. 7 illustrates a master-slave system in accordance with another embodiment of the invention.

FIG. 7 illustrates an alternate embodiment of the system 70. In the system of FIG. 7, delay paths 136A and 136B are used so that phase alignment at the positions A' and B' exists within the slave device 26A, instead of at the entrance of the slave device 26A, as shown in FIG. 5. In other words, the delay paths 136A and 136B establish an additional delay that produces an alignment in the clock signals at a delayed position, namely the position at nodes A' and B' in the slave device 26A.

FIG. 7 also departs from the embodiment of FIG. 5 in that the resistors 82 and 92 are respectively substituted with processing blocks 130A and 130B. Each processing block 130 includes a divide by "N" circuit 132 and a buffer 134. The divide by N circuit 132 outputs a clock pulse for every "N" clock pulses it receives, thereby reducing the frequency of the clock signal that is processed by the phase comparator 110. This technique is used to reduce jitter in the adjusted clock signal that is produced by the clock latency adjustment circuit 74. The processing block 130 also includes a buffer 134 which provides an amplified signal for processing the by clock latency adjustment circuit 74.

Figure 8:
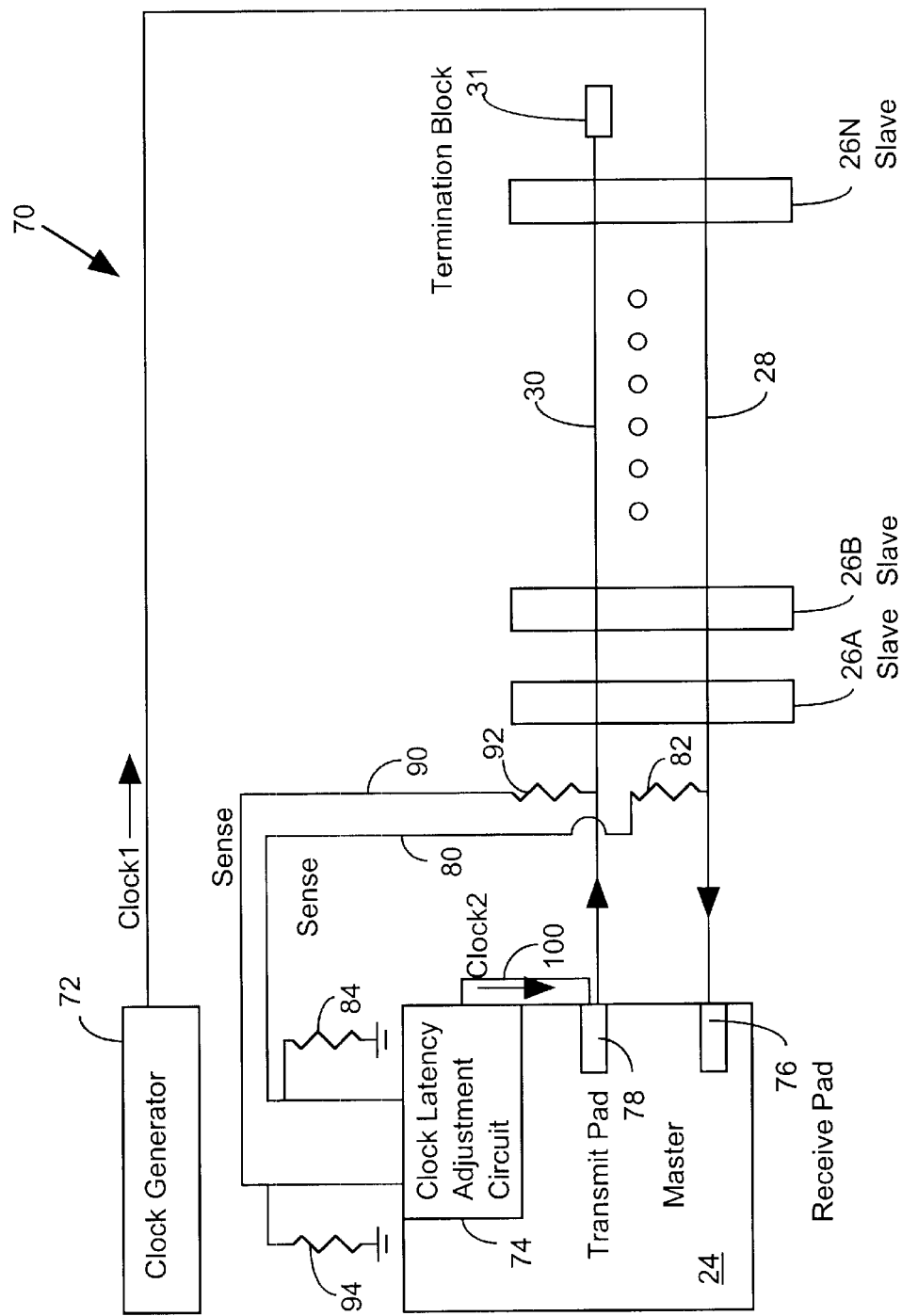
FIG. 8 illustrates a master-slave system in accordance with still another embodiment of the invention.

FIG. 8 illustrates an alternate embodiment of the invention. The system of FIG. 8 generally corresponds with the system of FIG. 5, however, in the system of FIG. 8, the clock latency adjustment circuit 74 is embedded in the master device 24. This embodiment of the invention simplifies the construction of the clock generator 72 and provides a shorter path for the adjusted clock signal as it travels to the transmit pad 78.

Figure 9:
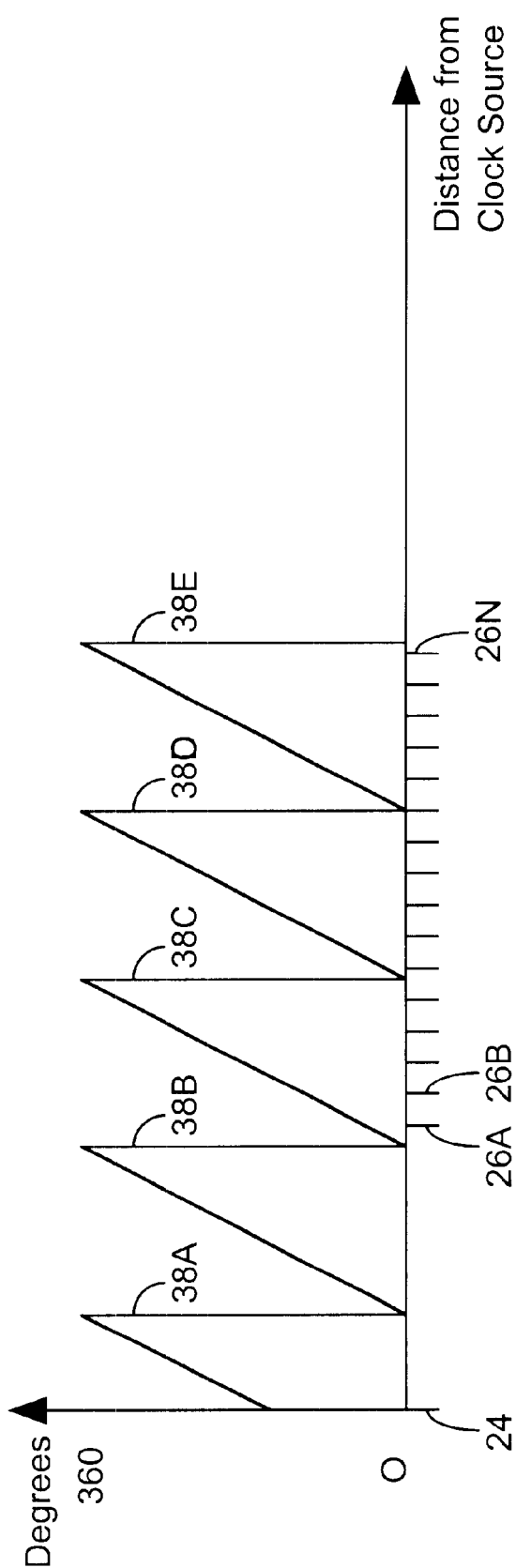
FIG. 9 illustrates the latent cycle improvement realized in accordance with an embodiment of the invention.

FIG. 9 illustrates the latent cycle improvement realized in accordance with the invention. Observe in FIG. 9 that, in accordance with the invention, the first slave device 26A observes a very small phase angle. This phase angle stands in contrast to the phase angle of the slave device 26A of FIG. 2B. This small phase angle at the first slave device 26A allows the last slave device 26N to be processed within fewer latent cycles. In the example of FIG. 9, the last slave device 26N is processed within three latent cycles, as shown with waveforms 38C, 38D, and 38E.

Figure 10:
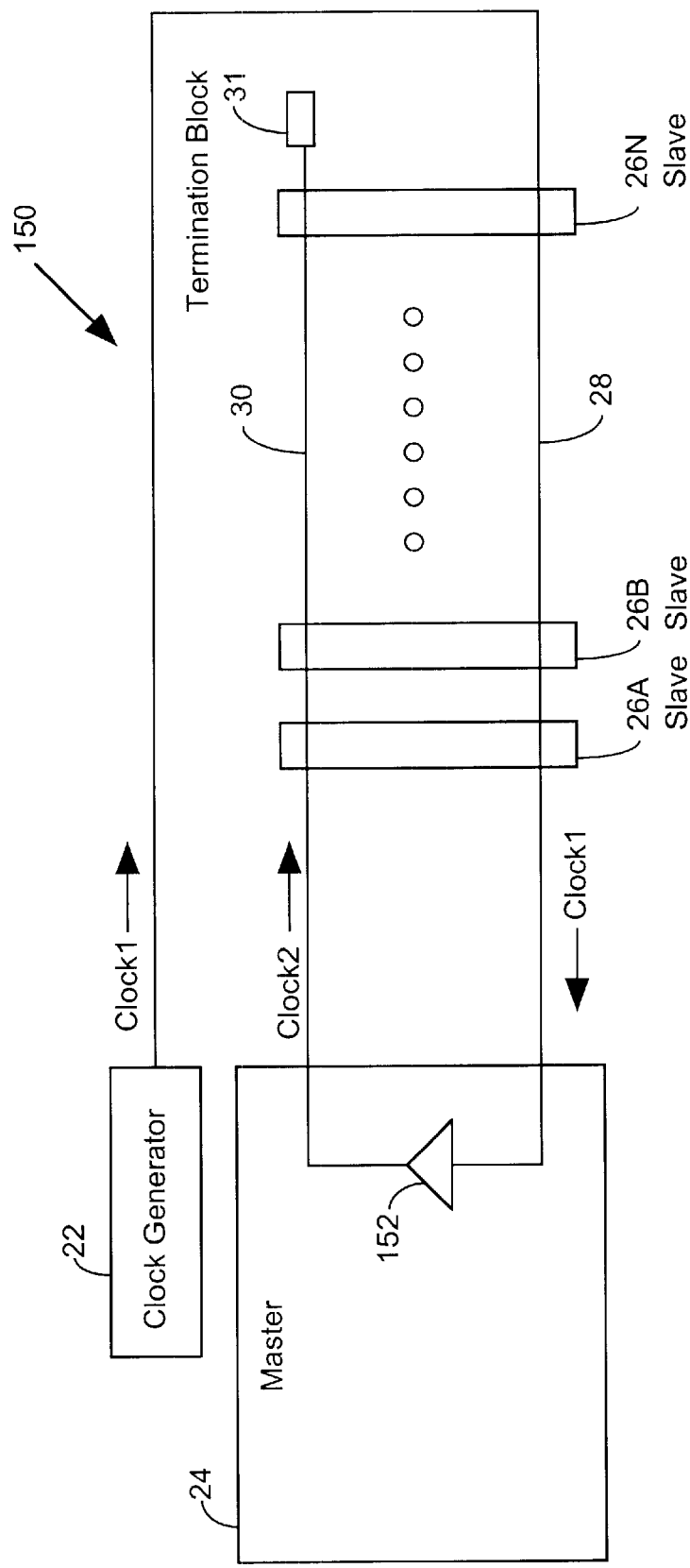
FIG. 10 illustrates a master-slave system in accordance with another embodiment of the invention.

FIG. 10 illustrates a system 150 forming an alternate embodiment of the invention. The system 150 of FIG. 10 does not establish the appropriate phase adjustment of the clock signal at the first slave device 26A, as was the case in the previous embodiments. Rather, in this embodiment a signal amplifying buffer 152 is used to generate a stronger signal at the first slave device 26A. As in the previous embodiments of the invention, with this embodiment, the first slave device 26A receives a strong signal (Clock2) from the master 24. That is, the amplitude of the clock-from-master signal at the first slave device 26A is higher than the amplitude of the clock-to-master signal at the first slave device 26A. However, unlike the previous embodiments of the invention, the clock signal does not have its phase adjusted. In other words, the phase shift introduced by the slave-to-master path 32 and the master-to-slave path 34 is not eliminated, as was the case in the previous embodiments.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, the thereby enable others skilled in the art to best utilize the invention and various embodiments with various modifications as are suited to the particular use contemplated. It is intended that the scope of the invention be defined by the following claims and their equivalents.

What is claimed is:

1. A digital system, comprising:
    a clock generator to generate a first clock signal;
    a clock driver to drive a second clock signal;
    a master device;
    a plurality of slave devices;
    a transmission channel with a clock-to-master path extending from said clock generator, through said plurality of slave devices, to said master device, and a clock-from-master path extending from said clock driver through said master device, through said plurality of slave devices to a last slave device of said plurality of slave devices, said transmission channel including a slave-to-master path positioned between a first slave device of said plurality of slave devices and said master device and a master-to-slave path positioned between said master device and said first slave device, the cumulative length of said slave-to-master path and said master-to-slave path creating a master routing phase shift between said first clock signal on said clock-to-master path and said second clock signal on said clock-from-master path;
    a first lead to sample said first clock signal on said slave-to-master path;
    a second lead to sample said second clock signal on said master-to-slave path; and
    a clock latency adjustment circuit connected to said first lead and said second lead to produce an adjusted clock signal on said master-to-slave path to compensate for said master routing phase shift.

2. The digital system of claim 1 wherein said clock latency adjustment circuit includes:
    a phase comparator to generate a phase error signal from said sampled clock signals from said first lead and said second lead; and
    a phase interpolator to generate said adjusted clock signal from a clock source and said phase error signal.

3. The digital system of claim 2 wherein said clock latency adjustment circuit is embedded in said clock generator.

4. The digital system of claim 2 wherein said clock latency adjustment circuit is embedded in said master device.

5. The digital system of claim 2 further comprising a first divider circuit connected to said first lead and a second divider circuit connected to said second lead, said first divider circuit and said second divider circuit reducing the clock frequencies of signals processed by said phase comparator to reduce phase jitter associated with said phase comparator.

6. The digital system of claim 1 further comprising a first resistor connected to said first lead and a second resistor connected to said second lead.

7. The digital system of claim 1 further comprising a first buffer circuit connected to said first lead and a second buffer circuit connected to said second lead.

8. The digital system of claim 1 wherein said adjusted clock signal is applied to said transmission channel such that said clock signal on said clock-from-master path at said first slave device is substantially in phase with said clock signal on said clock-to-master path at said first slave device.

9. The digital system of claim 1 wherein said clock-from-master path extending from said clock driver through said master device, through said plurality of slave devices to a last slave device of said plurality of slave devices, further extends to a termination block.

10. The digital system of claim 1, wherein said clock driver is located in said clock generator.

11. The digital system of claim 1, wherein said clock driver is located in said master device.

12. A digital system, comprising:
    a clock generator to generate a clock signal;
    a master device;
    a plurality of slave devices;
    a transmission channel with a clock-to-master path extending from said clock generator, through said plurality of slave devices, to said master device, and a clock-from-master path extending from said master device, through said plurality of slave devices, said transmission channel including a slave-to-master path positioned between a first slave device of said plurality of slave devices and said master device and a master-to-slave path positioned between said master device and said first slave device, the cumulative length of said slave-to-master path and said master-to-slave path creating a master routing phase shift between a clock signal on said clock-to-master path and a clock signal on said clock-from-master path;

a first lead to sample said clock signal on said slave-to-master path;

a second lead to sample said clock signal on said master-to-slave path; and a clock latency adjustment circuit, including:
    a phase comparator to generate a phase error signal from said sampled clock signals from said first lead and said second lead; and
    a phase interpolator, connected to said first lead and said second lead, to produce an adjusted clock signal on said master-to-slave path from a clock source and said phase error signal to compensate for said master routing phase shift.

13. The digital system of claim 12 wherein said clock latency adjustment circuit is embedded in said clock generator.

14. The digital system of claim 12 wherein said clock latency adjustment circuit is embedded in said master device.

15. The digital system of claim 12 further comprising a first divider circuit connected to said first lead and a second divider circuit connected to said second lead, said first divider circuit and said second divider circuit reducing the clock frequencies of signals processed by said phase comparator to reduce phase jitter associated with said phase comparator.

16. The digital system of claim 12 further comprising a first resistor connected to said first lead and a second resistor connected to said second lead.

17. The digital system of claim 12 further comprising a first buffer circuit connected to said first lead and a second buffer circuit connected to said second lead.

18. The digital system of claim 12 wherein said adjusted clock signal is applied to said transmission channel such that said clock signal on said clock-from-master path at said first slave device is substantially in phase with said clock signal on said clock-to-master path at said first slave device.

19. A digital system, comprising:
    a clock generator to generate a clock signal;
    a master device;
    a plurality of slave devices;
    a transmission channel with a clock-to-master path extending from said clock generator, through said plurality of slave devices, to said master device, and a clock-from-master path extending from said master device, through said plurality of slave devices, said transmission channel including a slave-to-master path positioned between a first slave device of said plurality of slave devices and said master device and a master-to-slave path positioned between said master device and said first slave device, the cumulative length of said slave-to-master path and said master-to-slave path creating a master routing phase shift between a clock signal on said clock-to-master path and a clock signal on said clock-from-master path;
    a first lead to sample said clock signal on said slave-to-master path;
    a second lead to sample said clock signal on said master-to-slave path; and
    a clock latency adjustment circuit connected to said first lead and said second lead to produce an adjusted clock signal on said master-to-slave path to compensate for said master routing phase shift, wherein said second lead includes a delay element such that when said adjusted clock signal is applied to said transmission channel, said clock signal from said clock-from-master path processed by said first slave device is substantially in phase with said clock signal from said clock-to-master path processed at said first slave device.

20. The digital system of claim 19 wherein each slave device of said plurality of slave devices is a memory device.

21. The digital system of claim 20 wherein said master device is a memory controller.

22. In a digital system of the type comprising a transmission channel having a data bus for transmitting data signals and a distinct clock bus for transmitting a clock signal having a clock signal time-of-flight that is a multiple of a single cycle of said clock signal, the transmission channel linking a master device to a plurality of slave devices, the clock bus carrying a first clock signal and a second clock signal traveling in opposite directions, the first clock signal at a first slave device of said plurality of slave devices being out of phase with the second clock signal at said first slave device, the improvement comprising:
    a clock latency adjustment circuit, including:
        a phase comparator to generate a phase error signal from said first clock signal and second clock signal; and
        a phase interpolator coupled to the phase comparator to produce an adjusted clock signal from said first clock signal and said phase error signal to substantially eliminate clock signal skew at said first slave device.

23. The digital system of claim 22 further comprising a first divider circuit to process said first clock signal and a second divider circuit to process said second clock signal, said first divider circuit and said second divider circuit reducing clock frequencies of signals processed by said phase comparator to reduce phase jitter associated with said phase comparator.

24. The digital system of claim 22 wherein said clock latency adjustment circuit is embedded in said master device.

25. A method of reducing latent clock cycles in a digital system, said method comprising the steps of:
    receiving a first clock signal at a slave device;
    collecting a second clock signal at said slave device that is out of phase with said first clock signal; the first and second clock signals both originating from outside the slave device; and
    processing said first clock signal and said second clock signal to produce an adjusted clock signal at said slave device that is substantially in phase with said first clock signal at said slave device, said processing including the steps of:
        generating a phase error signal from said first clock signal and said second clock signal; and
        creating said adjusted clock signal from a reference clock signal and said phase error signal.

26. The method of claim 25 wherein said processing step includes the step of processing selected cycles of said first clock signal and said second clock signal to reduce jitter in said phase error signal.

27. The method of claim 25 wherein said receiving step includes the step of processing said first clock signal and said second clock signal at said slave device to perform a memory operation.

* * * * *